US006285186B1

United States Patent
Morooka

(10) Patent No.: US 6,285,186 B1
(45) Date of Patent: Sep. 4, 2001

(54) SUPERCONDUCTING QUANTUM INTERFERENCE DEVICE HAVING BIAS WIRING LAYER

(75) Inventor: Toshimitsu Morooka, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/027,093

(22) Filed: Feb. 20, 1998

(30) Foreign Application Priority Data

Feb. 21, 1997 (JP) .................................................. 8-038167

(51) Int. Cl.[7] .......................... G01R 33/035; H01L 39/22
(52) U.S. Cl. .................................. 324/248; 505/846
(58) Field of Search ......................... 324/248; 505/845, 505/846, 160, 162; 257/31–36, 421; 336/DIG. 1

(56) References Cited

U.S. PATENT DOCUMENTS

| 5,252,921 | * | 10/1993 | Nakane et al. | .................. | 324/248 |
| 5,625,290 | * | 4/1997 | You | .................. | 324/248 |
| 5,854,492 | * | 12/1998 | Chinone et al. | .................. | 324/248 |

FOREIGN PATENT DOCUMENTS

| 0566499 | * | 10/1993 | (EP) | .................. | 324/248 |
| 64-021379 | | 1/1989 | (JP) . | | |
| 64-027671 | | 2/1989 | (JP) . | | |
| 8-334555 | | 12/1996 | (JP) . | | |

* cited by examiner

Primary Examiner—Jay Patidar
(74) Attorney, Agent, or Firm—Adams & Wilks

(57) ABSTRACT

A bias wiring layer for supplying a bias current to a DC-SQUID is disposed above or below the superconductive ring of the DC-SQUID. The bias wiring layer is routed such that it passes through an axis of symmetry so that the center of the wiring layer passes through the middle of the superconductive ring. By providing a bias wiring layer rather than external bias wire, it is possible to prevent the generation of a magnetic flux caused by a bias current. Since no magnetic flux is produced by a bias current and the DC-SQUID and the vicinity thereof are not interfered with by a bias current, elements integrated on the same substrate are not adversely affected. It is thus easy to match the phases of the magnetic flux-voltage characteristics of plural DC-SQUIDs constituting a SQUID array, which is significantly effective in increasing the modulated voltage.

34 Claims, 9 Drawing Sheets

SUPERCONDUCTING QUANTUM INTERFERENCE DEVICE HAVING BIAS WIRING LAYER

BACKGROUND OF THE INVENTION

The present invention relates to a superconducting quantum interference device for detecting a very small magnetic field, current, voltage, electromagnetic wave and the like and, more particularly, to a superconducting quantum interference device having a high sensitivity and a low noise.

FIG. 7 shows a basic structure of a DC-SQUID which is one type of known superconducting quantum interference device formed using the prior art. A superconductive ring is formed by a washer coil 2 and a pair of Josephson junctions 1 connected to both ends thereof. A bias line 7 for supplying a bias current is connected between the pair of Josephson junctions 1 and to a central portion of the washer coil 2 and is routed to bonding pads 11a. The washer coil 2 includes a slit cover 3 for reducing stray inductance at a slit portion. In this structure, the bias line 7 is routed such that it surrounds the periphery of the DC-SQUID.

The DC-SQUID is a device used for converting a magnetic flux into a voltage whose output varies relative to the magnetic flux crossing a superconductive ring internally at a cycle of one flux quantum (($\Phi_0$: $2.07\times10^{-15}$ Wb). The higher the modulated voltage, the more sensitive the device.

In the structure shown in FIG. 7, a magnetic flux is produced by the bias current flowing through the bias line 7. The magnetic flux couples to the DC-SQUID itself and also has an influence on the neighborhood thereof. The bias line 7 has significant influence because it forms a large ring.

FIG. 8 shows a configuration diagram of a superconducting quantum interference device wherein two DC-SQUIDs are integrated on a single substrate using the prior art. Bonding pads 11a are arranged in a row on one side of a substrate 12 to facilitate connection to a driving circuit. Each of the two sets of bonding pads 11a are provided close to each other. A bias current is applied to each of the DC-SQUIDs from a bias line 7. In this case, a magnetic flux produced by the bias line 7 of one of the DC-SQUID couples to the other DC-SQUID. The SQUID 1 for detecting an external magnetic flux also detects the magnetic flux produced at the SQUID 2 by the bias current.

FIG. 9 is a view of a SQUID array configured using the prior art. A SQUID array is used for increasing a voltage modulated by DC-SQUIDs and impedance output by the same. A SQUID array is formed by connecting N DC-SQUIDs in series into a row to provide a modulated voltage which is N times that available with one DC-SQUID. In a SQUID array, offset components of magnetic fluxes crossing of the DC-SQUIDs must be nullified or equalized. When offset magnetic fluxes in the superconductive rings are not equal, the periods of magnetic flux-voltage characteristics of the DC-SQUIDs do not match, which makes it impossible to increase the modulated voltage efficiently.

In FIG. 9, the bonding pads h1a are provided close to each other taking connection to a driving circuit into consideration. Since the SQUID 1 and SQUID 2 are surrounded by the bias lines 7 in different ways, the bias lines couple different amounts of magnetic flux. Therefore, the offset magnetic fluxes of all of the DC-SQUIDs are different, which disallows matching of magnetic flux-voltage characteristics and hence makes it difficult to increase the modulated voltage efficiently.

In a superconducting quantum interference device according to the prior art, a bias line for supplying a bias current to a DC-SQUID, a SQUID array or the like has been routed so as to surround the periphery thereof taking connection to a driving circuit into consideration. As a result, a bias line forms a large loop which couples an unnecessary magnetic flux into a superconductive ring of a DC-SQUID. There has been another problem in that when a plurality of DC-SQUIDs are integrated on the same substrate, interference occurs between magnetic fluxes produced by the bias currents of each other.

Further, in the case of a SQUID array wherein a plurality of DC-SQUIDs are connected in series, the amount of magnetic flux coupled by the bias lines varies between the DC-SQUIDs. As a result, it has been difficult to increase the modulated voltage efficiently because it has been impossible to match the period of the magnetic flux-voltage characteristics of each of them.

SUMMARY OF THE INVENTION

It is an object of the present invention to provide a bias wiring layer to cancel a magnetic flux produced by a bias current flowing through a DC-SQUID in order to suppress the generation of a magnetic flux due to a bias current flowing through a bias line.

It is a further object of the present invention to allow flexible arrangement of SQUIDs by the suppression of a magnetic flux produced by a bias current when a plurality of DC-SQUIDs are provided on the same substrate or when a SQUID array is formed.

DETAILED DESCRIPTION OF THE PREFERRED EMBODIMENTS

Embodiments of the present invention will be described with reference to the drawings.

Figure 1:
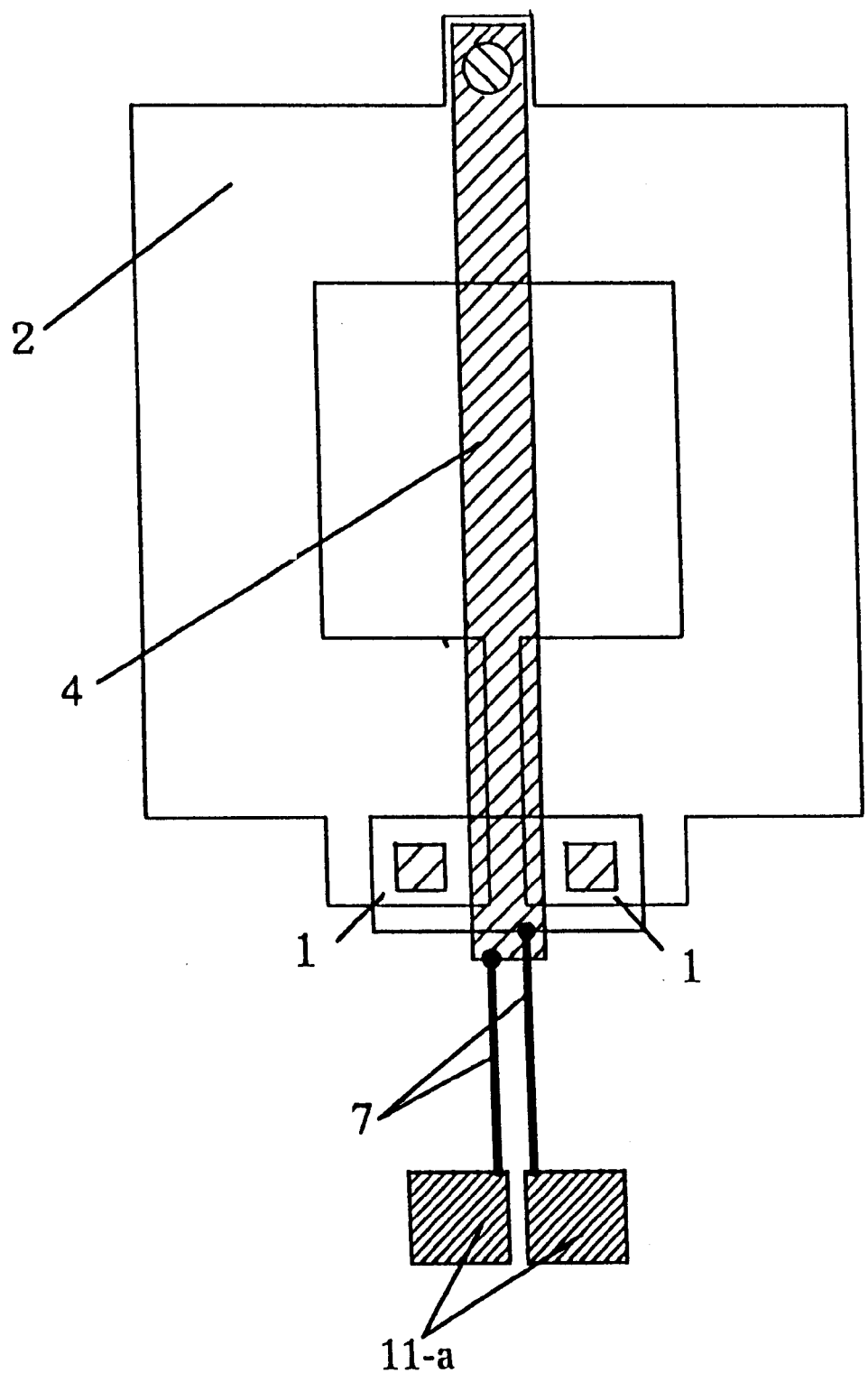
FIG. 1 is a view showing a configuration of a DC-SQUID which represents a first embodiment of the present invention.

FIG. 1 illustrates a configuration of a DC-SQUID which represents a first embodiment of the present invention. A superconductive ring is formed by a washer coil 2 and a pair of Josephson junctions 1 connected to both ends thereof. A bias wiring layer 4 for supplying a bias current is provided on a layer below the superconductive ring with a layer insulation film interposed therebetween. The bias wiring layer 4 is connected to a central portion of the washer coil 2 and passes through a symmetry axis which halves the superconductive ring to be routed to bias lines 7. The supply of a bias current to the DC-SQUID is input from the bias lines 7 connected between the pair of Josephson junctions 1 and is taken out through the bias wiring layer 4.

In the present embodiment, two bonding pads 11a for supplying the bias are provided close to each other. Further, since two bias lines 7 can be provided close to each other at the periphery of the DC-SQUID, a bias current can be supplied without forming a loop constituted by the bias lines. The bias wiring layer 4 passes through the symmetry axis that halves the superconductive ring, magnetic fluxes produced by bias currents crossing the two split parts have the same magnitude and are in opposite directions. Thus, the bias current does not interfere with the DC-SQUID itself. Further, since the bias current flowing through the DC-SQUID and the current flowing through the bias wiring layer are in opposite directions, generation of a magnetic flux in the neighborhood is suppressed. As a result, even when a plurality of superconducting devices are integrated on the same substrate, it is possible to prevent the elements from being interfered with by the magnetic flux of each other.

In addition, in the embodiment of FIG. 1, the line width of the bias wiring layer 4 is made thicker than the width of a slit of the washer coil 2. As a result, the bias wiring layer acts as a slit cover for reducing stray inductance at the slit portion of the washer coil.

Although the bias wiring layer 4 is provided below the superconductive ring in FIG. 1, it may be provided above the same.

Figure 2:
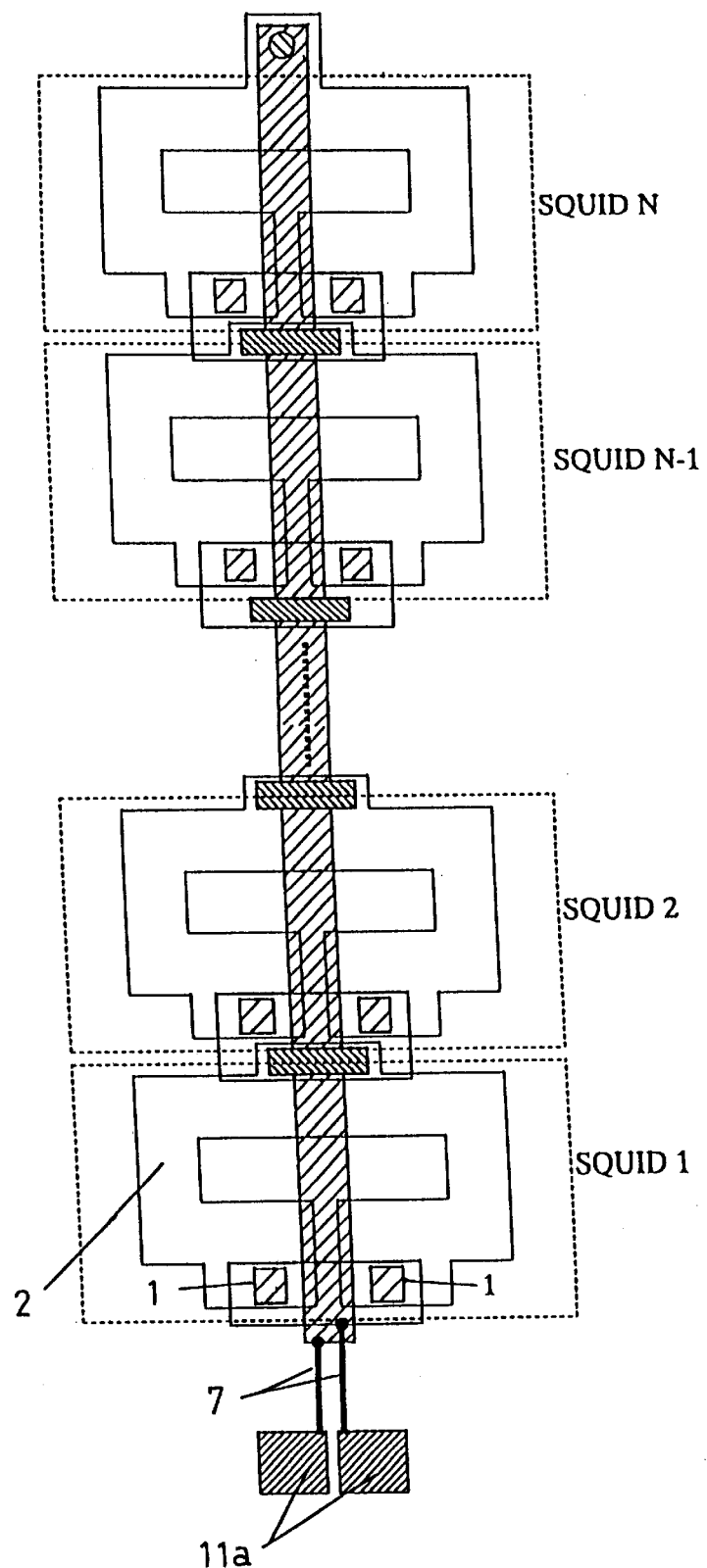
FIG. 2 is a view showing a configuration of a SQUID array which represents a second embodiment of the present invention.
Figure 3:
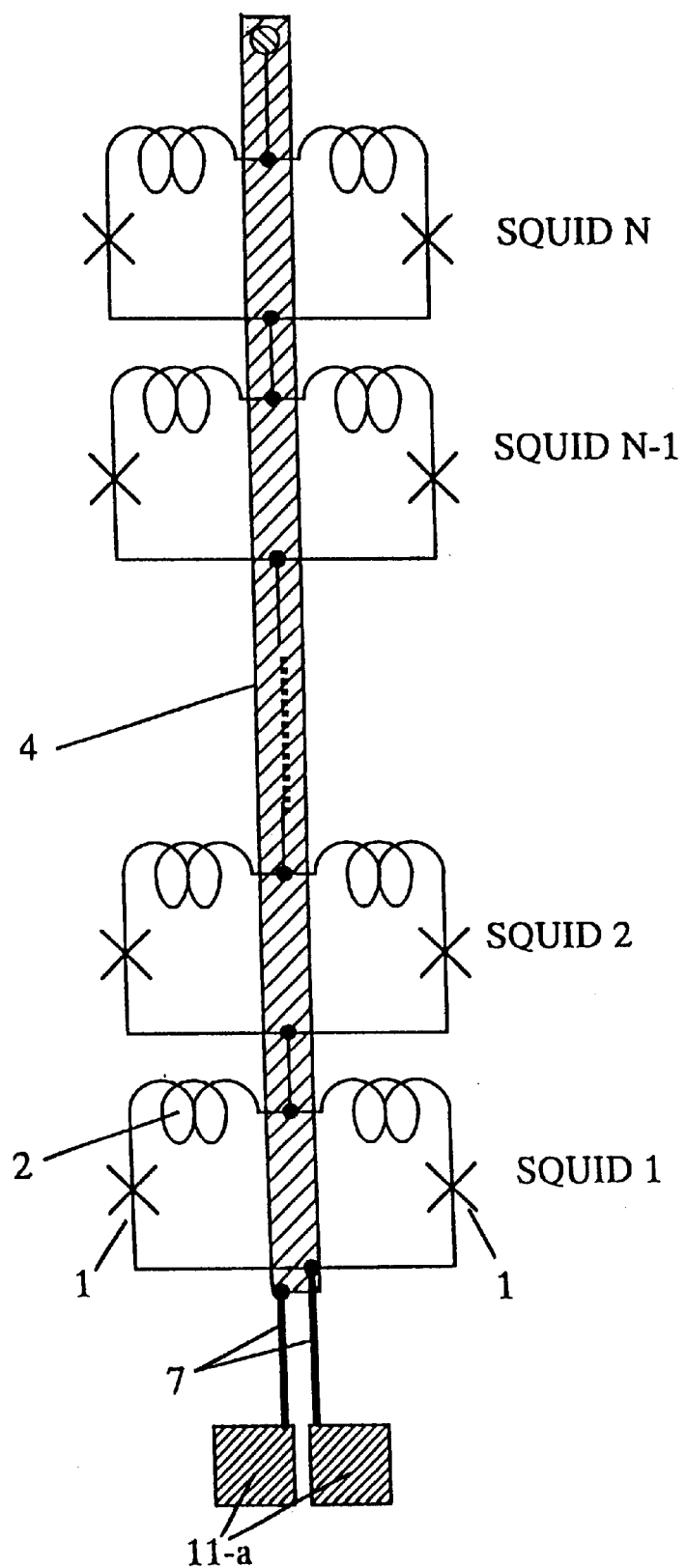
FIG. 3 is a view showing an equivalent circuit representing the second embodiment of the present invention.

FIG. 2 illustrates a configuration of a SQUID array which represents a second embodiment of the present invention. FIG. 3 is a view showing an equivalent circuit of FIG. 2. A superconductive ring is formed by a washer coil 2 and a pair of Josephson junctions 1 connected to both ends thereof. A bias wiring layer 4 for supplying a bias current is provided below the superconductive ring with a layer insulation film interposed therebetween. A SQUID array is formed by connecting N DC-SQUIDs in series to obtain a higher modulated voltage. The bias wiring layer 4 is provided in the connecting direction of the SQUID array. The bias wiring layer 4 is connected to a SQUID N located at an end of the SQUID array and passes through a symmetry axis which halves the superconductive ring of each DC-SQUID to be routed to a bias line 7. Another bias line 7 is connected to a SQUID 1. The two bias lines are provided such that they extend close to each other from bonding pads 11a for supplying a bias current to the SQUID array.

As indicated in the first embodiment, the present embodiment prevents the DC-SQUIDs themselves forming the SQUID array from being interfered with by a magnetic flux produced by a bias current. It is therefore possible to nullify the offset component of a magnetic flux crossing each DC-SQUID. As a result, the phases of magnetic flux-voltage characteristics are matched, and the modulated voltage of the SQUID array can be efficiently increased to N times that available with one DC-SQUID.

Figure 4:
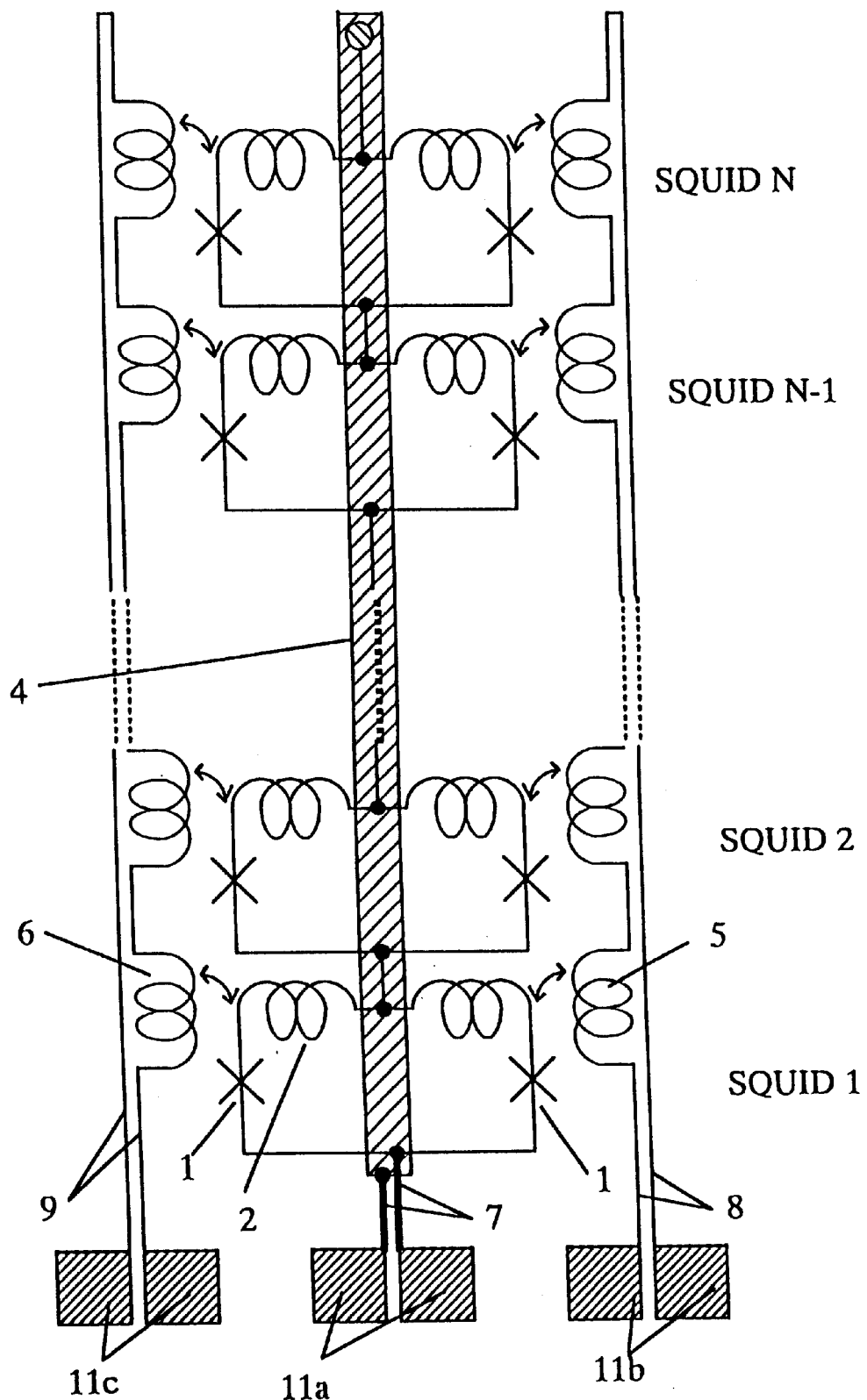
FIG. 4 is a view showing an equivalent circuit of a SQUID array equipped with input lines and feedback modulation lines which represents a second embodiment of the present invention.

FIG. 4 is an equivalent circuit diagram of a SQUID array which represents a third embodiment of the present invention. A superconductive ring is formed by a washer coil 2 and Josephson junctions 1 connected to both ends thereof. Here, a SQUID array is integrated with an input line 8 for inputting a magnetic flux from the outside and a feedback-modulation line 9 for driving a FLL circuit. An input coil 5 for an input magnetic flux and a feedback-modulation coil 6 for a feedback-modulation magnetic flux are magnetically coupled to the washer coil 2 of each of the DC-SQUIDs that constitute the SQUID array. The input coil 5 and feedback-modulation coil 6 are connected in series like the superconductive ring and are connected to the input line 8 and the feedback-modulation line 9. In FIG. 4, two bonding pads 11b for the input magnetic flux and two bonding pads 11c for a feedback-modulation magnetic flux are provided close to each other. The generation of a magnetic flux is suppressed in the regions of the input coil 5 and the feedback modulation coil 6 which are not coupled to the washer coil 2 by a magnetic flux because two lines on the supply side and take-out side are provided close to each other. Therefore, the coupling coefficient of the input coil 5 and the coupling coefficient of the feedback modulation coil 6 are constant in the DC-SQUIDs, and phases of magnetic flux-voltage characteristics of the DC-SQUIDs match.

Figure 5:
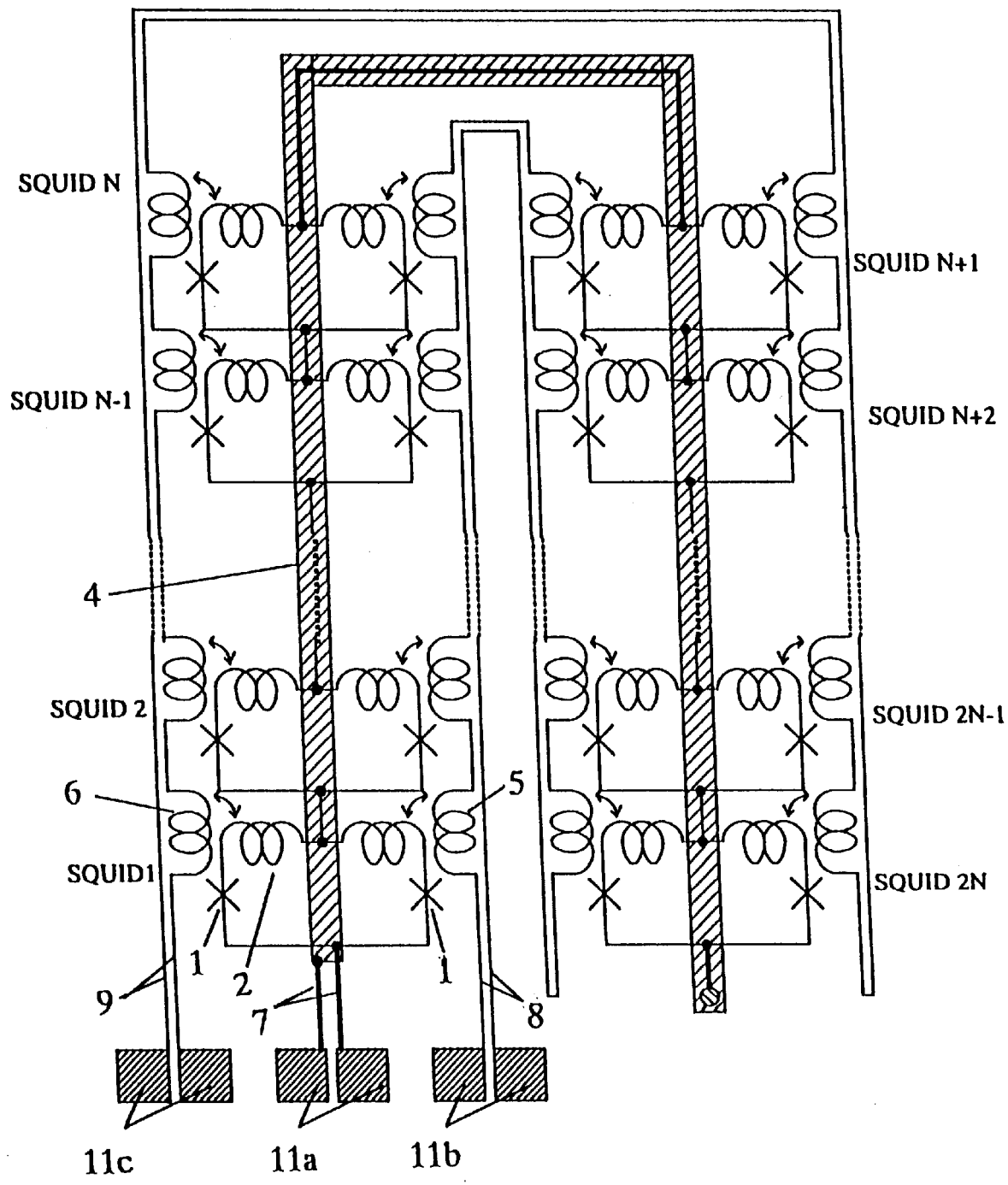
FIG. 5 is a view showing an equivalent circuit of a SQUID array formed in a meander configuration which represents a fourth embodiment of the present invention.

FIG. 5 is an equivalent circuit diagram of a SQUID array formed in a meander configuration which represents a fourth embodiment of the present invention. By connecting SQUID arrays as shown in FIG. 4 in series into two rows in a meander configuration, a still higher modulated voltage is obtained. In this case, the bias wiring layer 4 is also formed in a meander configuration along the SQUID arrays. The bias wiring layer 4 is connected to a SQUID 2N at the end and passes through a symmetry axis which halves the superconductive ring of each DC-SQUID to be routed to a bias line 7. Another bias line 7 is connected to a SQUID 1. In the structure for wiring all of the bias lines 7, input lines 8 and feedback-modulation lines 9 to the SQUID arrays, two lines at the supply side and draw-out side are provided close to each other. In the present embodiment, as in the first embodiment, since the bias current flowing through the SQUID arrays and the current flowing through the bias wiring layer 4 are in opposite directions, the generation of a magnetic flux in the neighborhood thereof is suppressed. This makes it possible to prevent adjoining SQUID arrays from being interfered with by a magnetic flux from each other and hence to nullify the offset magnetic flux in all of the DC-SQUID. As a result, the phases of magnetic flux-voltage characteristics of all of them match, and the modulated voltage of the SQUID arrays can be efficiently increased to 2N times that available with one DC-SQUID. Although the present embodiment employs a two rows arranged in a meandering manner, the use of a structure according to the present invention allows a SQUID array to be formed regardless of the number of meandering rows, and a desired modulated voltage can be provided.

Figure 6:
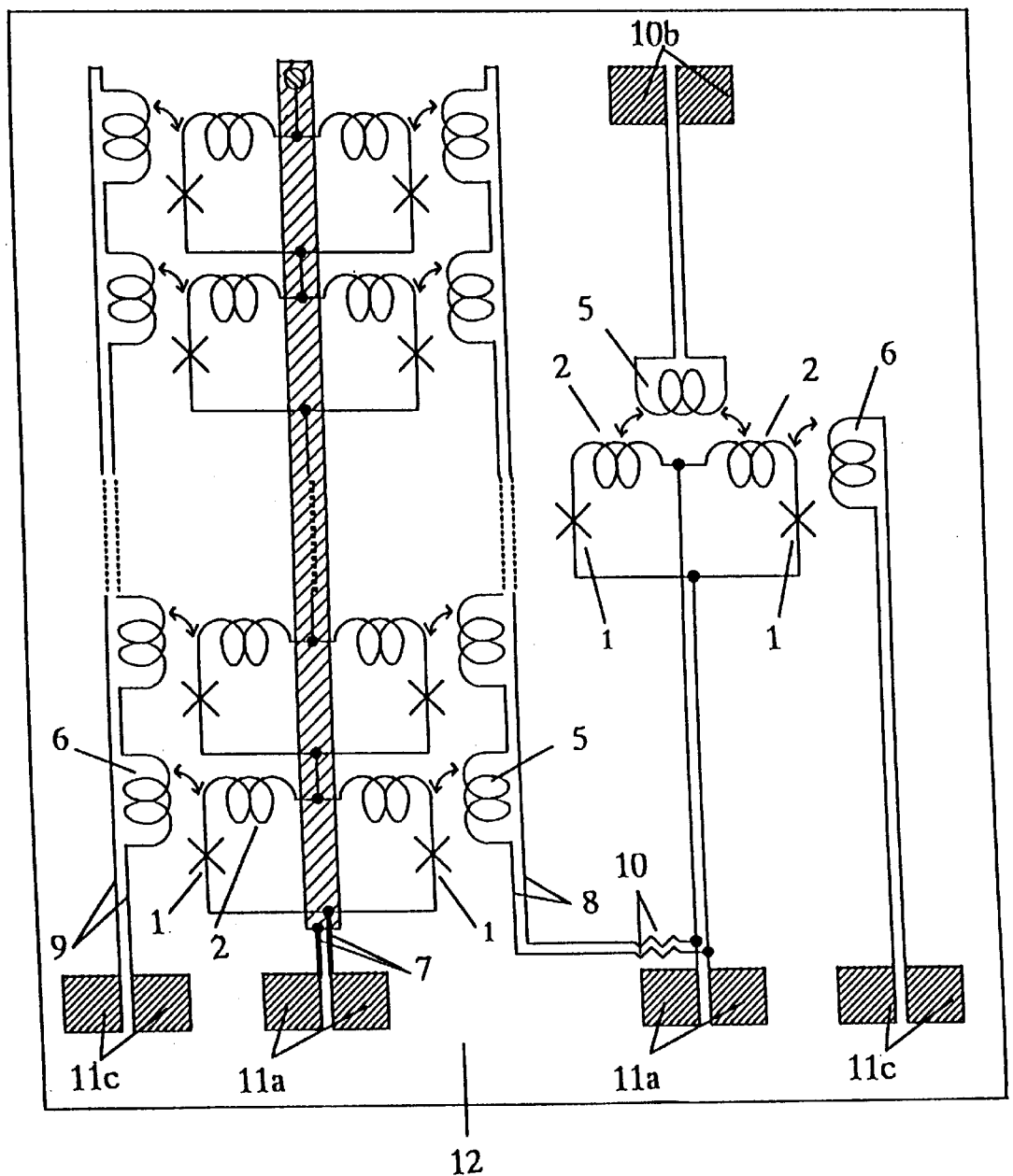
FIG. 6 is a view showing an equivalent circuit of a superconducting quantum interference device which represents a fifth embodiment of the present invention.
Figure 7:
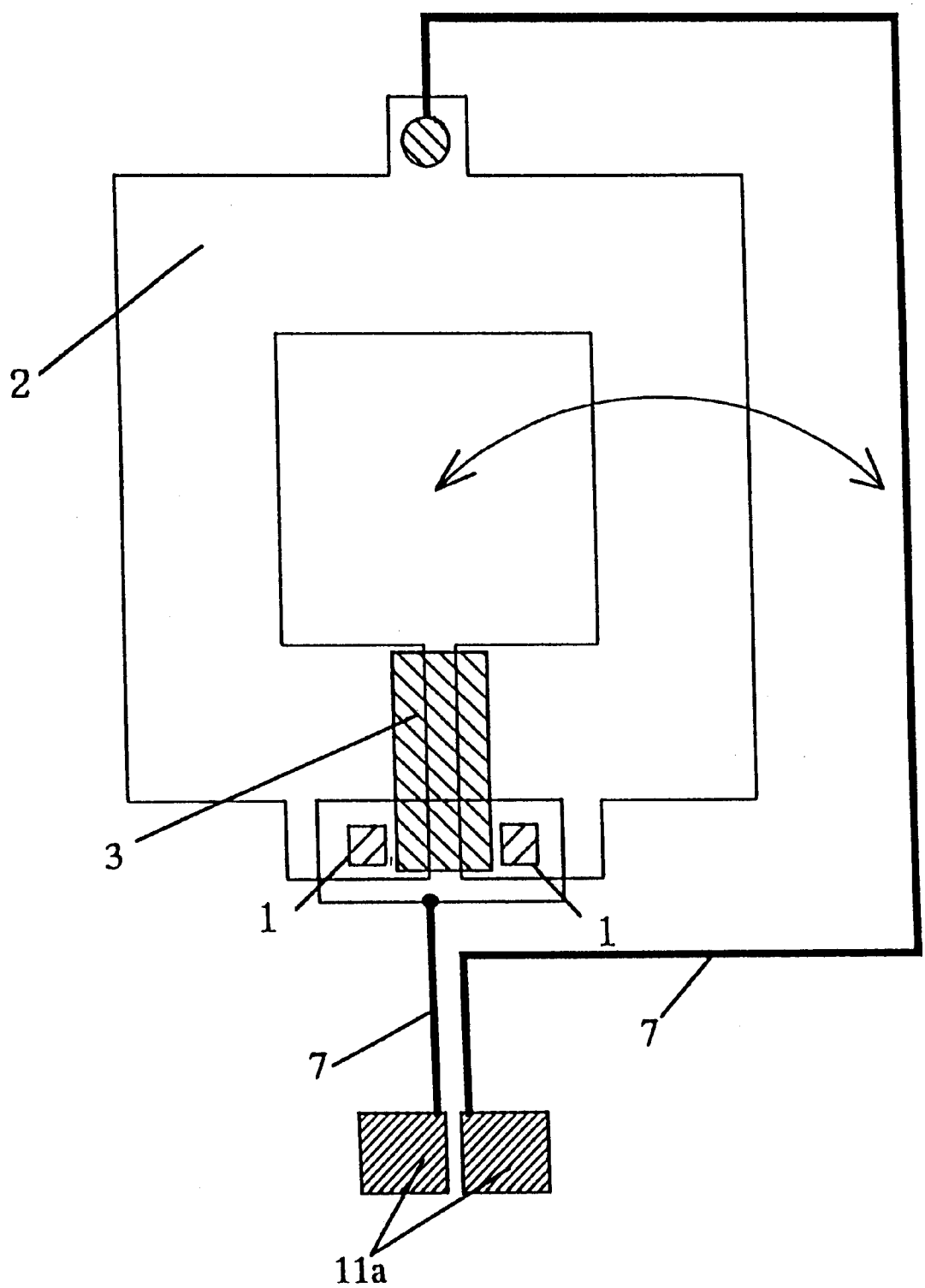
FIG. 7 is a view showing a configuration of a superconducting quantum interference device formed using the prior art.
Figure 8:
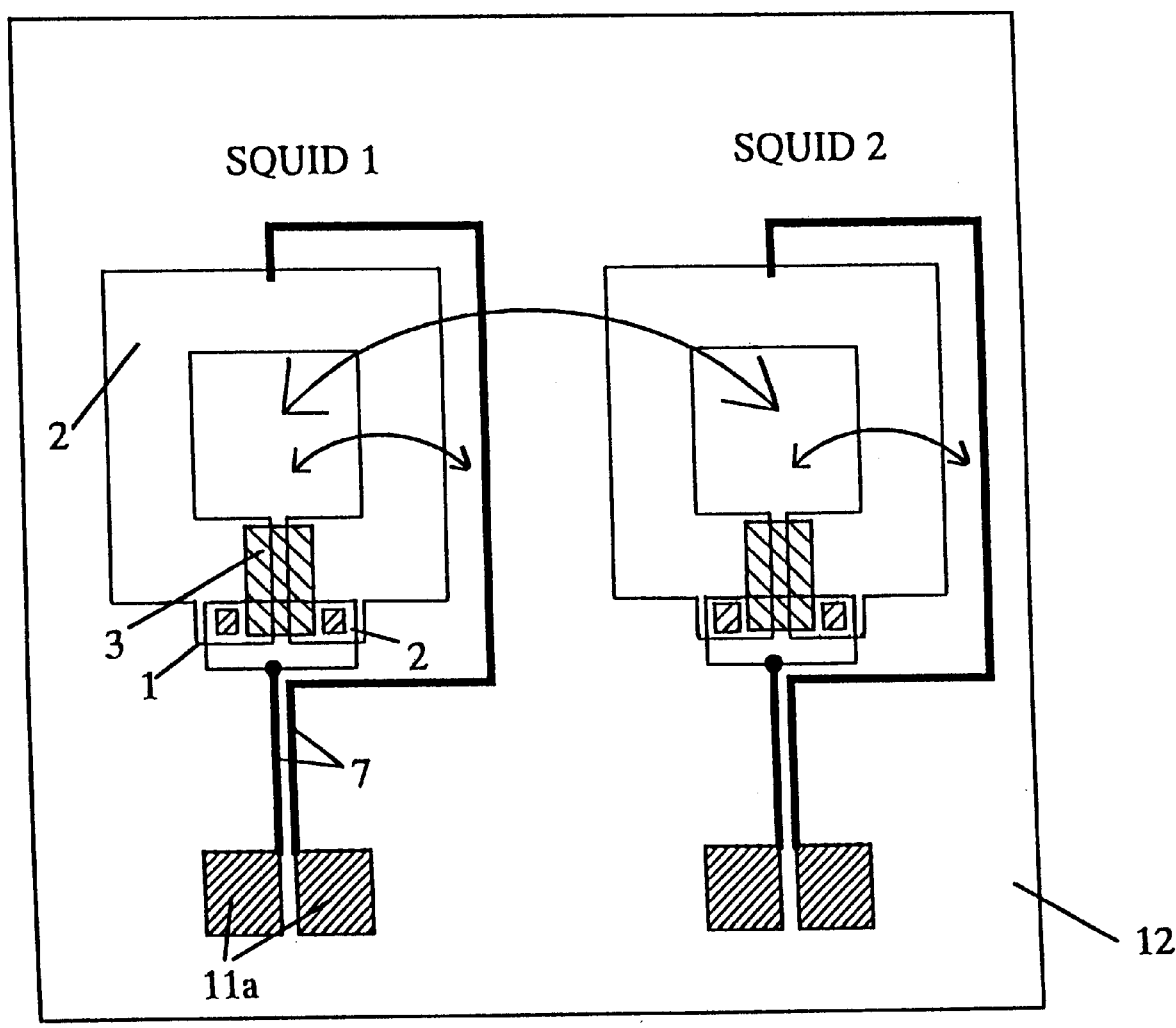
FIG. 8 is a view showing a configuration of two superconducting quantum interference devices which DC-SQUID wherein two DC-SQUIDs are integrally formedusing theprior art.
Figure 9:
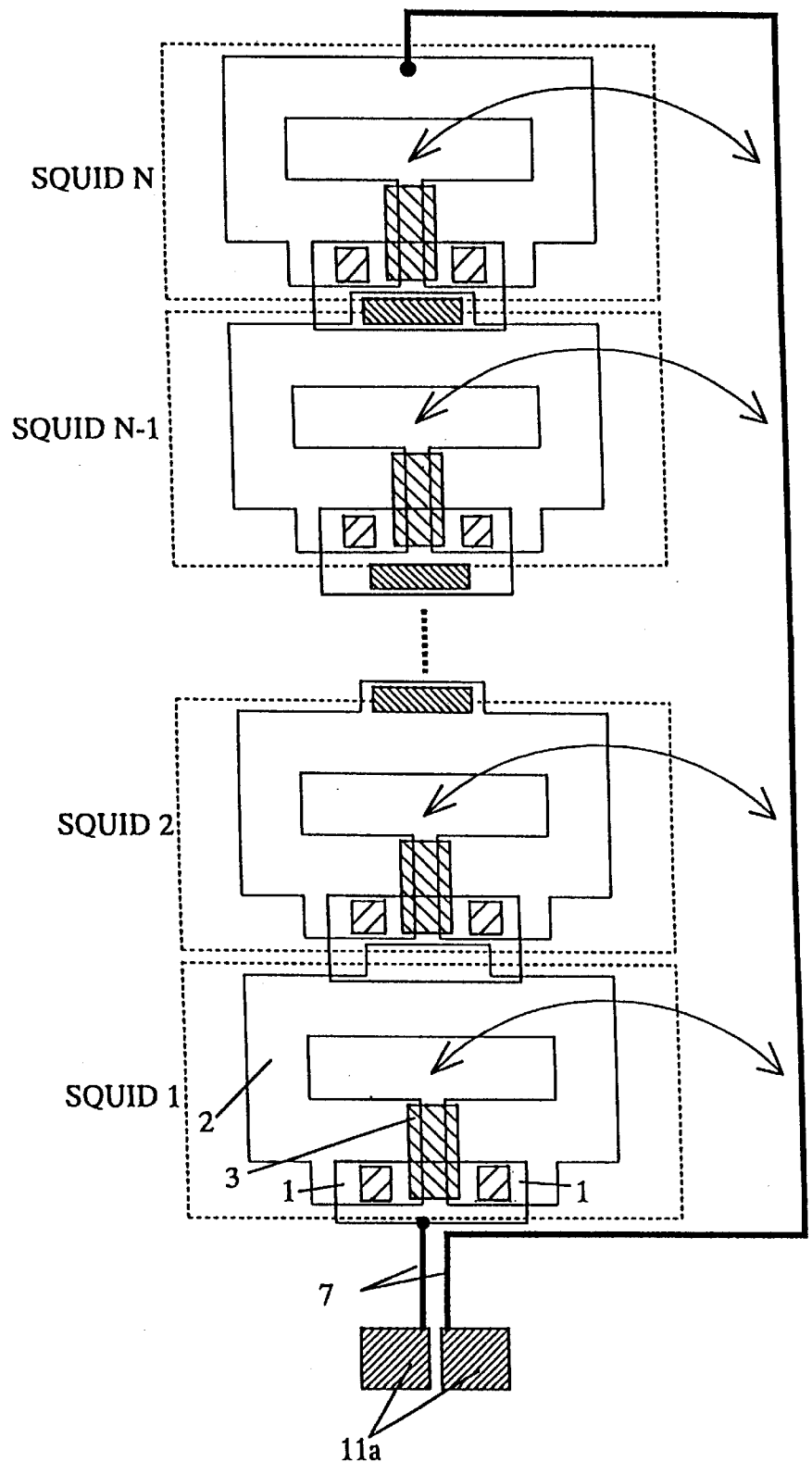
FIG. 9 is a view showing a configuration of a SQUID array formed using the prior art.

FIG. 6 is an equivalent circuit diagram of a superconducting quantum interference device which represents a fifth embodiment of the present invention. A single DC-SQUID and a SQUID array are integrated on a substrate 12. The DC-SQUID is integrated with an input coil 5 and a feedback modulation coil 6. The SQUID array is also integrated with input lines 8 and feedback modulation lines 9. The output of the DC-SQUID is connected to the input lines of the SQUID array through resistors 10 for current conversion. The single DC-SQUID functions as a magnetic flux detection SQUID for detecting a magnetic flux. The SQUID array functions as an ultra low noise preamplifier for amplifying a voltage signal detected by the magnetic flux detection SQUID. The detection SQUID converts a magnetic flux input through the input coil 5 into a voltage. The converted voltage is converted into a current by the resistors 10 for current conversion. The current is delivered to the SQUID array through the input lines 8 to be converted into a high output voltage. This configuration makes it possible to increase the output of aDC-SQUID, to integrate a ultra low noise preamplifier and to increase output impedance.

Although the washer coil of a DC-SQUID described in the above embodiments has a single washer structure constituted by a single washer, it is possible to employ a configuration utilizing DC-SQUID having a multi-washer structure constituted by a plurality of washers connected in series or in parallel.

The present invention is carried out in the modes as described above and provides effects as described below.

By providing a bias wiring layer for applying a bias current in a DC-SQUID and by disposing the bias wiring layer above or below the superconductive ring of the DC-SQUID, it is possible to suppress the generation of a magnetic flux due to the bias current, which results in a effect of preventing the DC-SQUID itself or elements in the neighborhood thereof from being interfered by a magnetic flux.

By passing the bias wiring layer through a symmetry axis which halves the superconductive ring of the DC-SQUID, the generation of a magnetic flux due to a bias current can be more effectively suppressed.

Further, by making the line width of the bias wiring layer thicker than the width of a slit in the washer coil that constitutes the superconductive ring, it is possible to delete a step of forming a slit cover for the washer coil and to provide a function of a slit cover for reducing stray inductance at the slit portion of the washer coil.

Further, in a SQUID array wherein DC-SQUIDs are series-connected in a row, the periods of magnetic flux-voltage characteristics of the DC-SQUIDs can be matched, which is especially effective in increasing the modulated voltage.

Furthermore, when a meander structure wherein DC-SQUIDs are series-connected in a row, it is possible to suppress the interference of a magnetic flux between the SQUID arrays to provide a still higher modulated voltage.

Moreover, an ultra-sensitive fluxmeter having high impedance which is not available with a single DC-SQUID can be configured by integrating a SQUID for detecting a magnetic flux and a SQUID array on the same substrate.

What is claimed is:

1. A superconducting quantum interference device array having a plurality of series-connected superconducting quantum interference devices formed by integrating superconductive thin films on a substrate, comprising: a plurality of DC-SQUIDs each having a superconductive ring formed by a washer coil having opposite ends and a pair of Josephson junctions connected to respective ends thereof; and a bias wiring film formed separately from the washer coil and disposed above or below the superconductive ring of each DC-SQUID for supplying a bias current, the bias wiring film extending along a central axis of each of the DC-SQUIDs.

2. A superconducting quantum interference device array as claimed in claim 1; wherein the bias wiring film passes through an axis of symmetry of each DC-SQUID so that one half of the DC-SQUID extends laterally to one side of a center of the bias wiring film and the other half of the DC-SQUID extends laterally to another side of the center of the bias wiring film.

3. A superconducting quantum interference device array as claimed in claim 1; wherein the washer coil has a slit portion between the respective ends thereof, and the bias wiring film has a width greater than the width of the slit portion of the washer coil and covers the slit portion.

4. A superconducting quantum interference device array as claimed in claim 1; wherein the plurality of DC-SQUIDs are connected in plural rows and the plural rows are connected in a meandering configuration.

5. A superconducting quantum interference device array according to claim 1; wherein the bias wiring layer traverses substantially the entire washer coil of each DC-SQUID along the axis of symmetry so that one half of each washer coil extends laterally to one side of the center of the bias wiring line and the other half of each washer coil extends laterally to the other side of the center of the bias wiring line.

6. A superconducting quantum interference device array according to claim 1; wherein each DC-SQUID further comprises an interlayer insulation film disposed between the superconductive ring and the bias wiring film.

7. A superconducting quantum interference device array having a plurality of DC-SQUIDs, each DC-SQUID comprising: a substrate; a superconductive ring disposed on the substrate; at least one Josephson junction connected to the superconductive ring; and a bias wiring layer conprising a thin film formed separately from the superconductive ring above or below the superconductive ring for supplying a bias current; wherein the bias wiring layer extends through a central axis of each of the plurality of DC-SQUIDs.

8. A superconducting quantum interference device array according to claim 7; wherein the bias wiring layer passes through an axis of symmetry of the superconductive ring of each DC-SQUID so that one half of the superconductive ring extends laterally to one side of a center of the bias wiring layer and the other half of the superconductive ring extends laterally to another side of the center of the bias wiring layer.

9. A superconducting quantum interference device array according to claim 7; wherein the superconductive ring of each DC-SQUID comprises a washer coil having opposite ends, and one of Josephson junctions is connected to each end of the washer coil.

10. A superconducting quantum interference device array according to claim 9; wherein the opposite ends of the washer coil of each DC-SQUID are spaced apart by a slit portion, and bias wiring layer covers the slit portion.

11. A superconducting quantum interference device array according to claim 9; wherein the bias wiring layer passes through an axis of symmertry of the washer coil of each DC-SQUID so that one half of the washer coil extends laterally to one side of a center of the bias wiring layer and the other half of the washer coil extends laterally to another side of the center of the bias wiring layer.

12. A superconducting quantum interference device array according to claim 7; wherein the superconductive ring of each DC-SQUID comprises a washer coil formed in the shape of an open ring having ends closely spaced by a slit portion, and one of the Josephson junctions is connected each end of the washer coil.

13. A superconducting quantum interference device array according to claim 12; wherein the bias wiring layer covers the slit portion of the washer coil of each DC-SQUID.

14. A superconducting quantum interference device array according to claim 12; wherein the bias wiring layer has a width greater than the width of the slit portion of the washer coil of each DC-SQUID and covers the slit portion of each DC-SQUID.

15. A superconducting quantum interference device array according to claim 7; wherein the superconductive ring of each DC-SQUID comprises a washer coil, an input coil for coupling the washer coil to an input source receptive of an input magnetic flux, and a feedback-modulation coil for coupling the washer coil to an output circuit.

16. A superconducting quantum interference device array according to claim 15; wherein the bias wiring layer passes through an axis of symmetry of the washer coil of each DC-SQUID so that one half of the washer coil extends laterally to one side of a center of the bias wiring layer and the other half of the washer coil extends laterally to another side of the center of the bias wiring layer.

17. A superconducting quantum interference device array according to claim 16; wherein the washer coil of each DC-SQUID has opposite ends, and one of the Josephson junctions is connected to each end of the washer coil.

18. A superconducting quantum interference device array according to claim 17; wherein the opposite ends of the washer coil of each DC-SQUID are spaced apart by a slit portion, and the bias wiring layer covers the slit portion.

19. A superconducting quantum interference device array according to claim 15; further comprising an input line connected to the input coil of each DC-SQUID and a feedback-modulation line connected to the feedback-modulation coil of each DC-SQUID.

20. A superconducting quantum interference device array according to claim 19; wherein the bias wiring layer passes through an axis of symmetry of the washer coil of each DC-SQUID so that one half of the washer coil extends laterally to one side of a center of the bias wiring layer and the other half of the washer coil extends laterally to another side of the center of the bias wiring layer.

21. A superconducting quantum interference device array according to claim 20; wherein the washer coil of each DC-SQUID has opposite ends, and one of the Josephson junctions is connected to each end of the washer coil.

22. A superconducting quantum interference device array according to claim 21; wherein the opposite ends of the washer coil of each DC-SQUID are spaced apart by a slit portion, and the bias wiring layer covers the slit portion.

23. A superconducting quantum interference device array according to claim 22; wherein the plurality of DC-SQUIDs are connected in series in a row.

24. A superconducting quantum interference device array according to claim 23; wherein the plurality of of DC-SQUIDs extend in a straight row.

25. A superconducting quantum interference device array according to claim 23; wherein the plurality of DC-SQUIDs extend in a meandering row.

26. A superconducting quantum interfernce device array according to claim 23; wherein the plurality of DC-SQUIDs are connected in a plurality of straight rows, and, the rows are connected in a meandering fashion.

27. A superconducting quantum interference device array according to claim 7; wherein the plurality of DC-SQUIDs are connected in series in a row.

28. A superconducting quantum interference device array according to claim 27; wherein the plurality of DC-SQUIDs extend in a straight row.

29. A superconducting quantum interference device array according to claim 27; wherein the plurality of DC-SQUIDs extend in a meandering row.

30. A superconducting quantum interference device array according to claim 27; wherein the plurality of DC-SQUIDs are connected in a plurality of straight rows, and the rows are connected in a meandering fashion.

31. A superconductive quantum interference device array according to claim 7; wherein the bias wiring layer traverses substantially the entire washer coil of each DC-SQUID along the axis of symmetry so that one half of each washer coil extends laterally to one side of the center of the bias wiring layer and the other half of each washer coil extends laterally to the other side of the center of the bias wiring line.

32. A superconducting quantum interference device array according to claim 7; wherein each DC-SQUID further comprises an interlayer insulation film disposed between the superconductive ring and the bias wiring film.

33. A superconducting quantum interference device array comprising a plurality of series- connected DC-SQUIDS, each DC-SQUID comprising: a substrate; a superconductive ring comprising a washer coil disposed on the substrate; at least one Josephson junction connected to the superconductive ring; and a bias wiring layer comprising a thin film disposed above or below and formed separately from the superconductive ring for supplying a bias current, the bias wiring layer passing through an axis of symmetry of the washer coil of each of the DC-SQUIDs so that one half of each washer coil extends laterally to one side of a center of the bias wiring layer and the other half of each washer coil extends laterally to another side of the center of the bias wiring layer.

34. A superconducting quantum interference device array according to claim 33; wherein each DC-SQUID further comprises an interlayer insulation film disposed between the superconductive ring and the bias wiring film.

* * * * *